United States Patent [19]
Cliff et al.

[11] Patent Number: 5,999,015
[45] Date of Patent: Dec. 7, 1999

[54] LOGIC REGION RESOURCES FOR PROGRAMMABLE LOGIC DEVICES

[75] Inventors: Richard G. Cliff, Milpitas; Francis B. Heile, Santa Clara; Joseph Huang, San Jose; David W. Mendel, Sunnyvale; Bruce B. Pedersen, San Jose; Chiakang Sung, Milpitas; Bonnie I. Wang, Cupertino, all of Calif.

[73] Assignee: Altera Corporation, San Jose, Calif.

[21] Appl. No.: 08/902,416

[22] Filed: Jul. 29, 1997

Related U.S. Application Data

[60] Provisional application No. 60/038,288, Feb. 20, 1997.

[51] Int. Cl.⁶ ............................ G06F 7/38; H03K 19/177
[52] U.S. Cl. .................................. 326/39; 326/40; 326/41
[58] Field of Search ................................ 326/39, 40, 41, 326/37, 38

[56] References Cited

U.S. PATENT DOCUMENTS

| | | |
|---|---|---|
| Re. 34,363 | 8/1993 | Freeman . |
| 3,473,160 | 10/1969 | Wahlstrom ........................... 340/172.5 |
| 4,609,986 | 9/1986 | Hartmann et al. ...................... 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. ...................... 364/900 |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 5,023,606 | 6/1991 | Kaplinsky ............................ 340/825.8 |
| 5,073,729 | 12/1991 | Greene et al. . |
| 5,121,006 | 6/1992 | Pedersen .................................. 326/38 |

(List continued on next page.)

FOREIGN PATENT DOCUMENTS

| | | | |
|---|---|---|---|
| 454352 A1 | 10/1991 | European Pat. Off. ..... | H03K 19/177 |
| 463746 A2 | 1/1992 | European Pat. Off. ........ | G06F 15/60 |
| 630115 A2 | 12/1994 | European Pat. Off. ..... | H03K 19/177 |
| WO 95/04404 | 2/1995 | WIPO .......................... | H03K 19/177 |
| WO 95/22205 | 8/1995 | WIPO .......................... | H03K 19/177 |

OTHER PUBLICATIONS

R. C. Minnick, "A Survey of Microcellular Research," Journal of the Association for Computing Machinery, vol. 14, No. 2, pp. 203–41, Apr. 1967.

S. E. Wahlstrom, "Programmable Logic Arrays—Cheaper by the Millions,"electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook*, Apr. 1992, Actel Corporation, Sunnyvale, CA, pp. 1–35 through 1–44.

*The Programmable Logic Data Book*, 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

*Primary Examiner*—Michael Toker
*Assistant Examiner*—Daniel D. Chang
*Attorney, Agent, or Firm*—Fish & Neave; Robert R. Jackson

[57] ABSTRACT

A programmable logic device has subregions of programmable logic grouped together in logic regions. The subregions in each region share several control signals, which can be selected either from relatively global conductors on the device or from data inputs to the region. The control signals allow synchronous or asynchronous clearing of a register in each subregion. The control signals also allow synchronous loading of the register in each subregion, and the data loaded can be either one of the data inputs to the subregion (so-called lonely register operation) or a signal produced by the logic of the subregion.

48 Claims, 5 Drawing Sheets

U.S. PATENT DOCUMENTS

| | | |
|---|---|---|
| 5,122,685 | 6/1992 | Chan et al. . |
| 5,132,571 | 7/1992 | McCollum et al. . |
| 5,144,166 | 9/1992 | Camarota et al. . |
| 5,208,491 | 5/1993 | Ebeling et al. . |
| 5,218,240 | 6/1993 | Camarota et al. . |
| 5,220,214 | 6/1993 | Pedersen . |
| 5,225,810 | 7/1993 | Agrawal et al. . |
| 5,255,203 | 10/1993 | Agrawal et al. . |
| 5,258,668 | 11/1993 | Cliff et al. ................................. 326/41 |
| 5,260,610 | 11/1993 | Pedersen et al. . |
| 5,260,611 | 11/1993 | Cliff et al. . |
| 5,274,581 | 12/1993 | Cliff et al. ................................. 364/784 |
| 5,338,984 | 8/1994 | Sutherland . |
| 5,350,954 | 9/1994 | Patel . |
| 5,371,422 | 12/1994 | Patel et al. ................................. 326/41 |
| 5,448,186 | 9/1995 | Kawata ................................. 326/41 |
| 5,467,029 | 11/1995 | Taffe et al. ................................. 326/41 |
| 5,469,003 | 11/1995 | Kean ................................. 326/39 |
| 5,483,178 | 1/1996 | Costello et al. ................................. 326/41 |
| 5,509,128 | 4/1996 | Chan ................................. 395/311 |

5,999,015

LOGIC REGION RESOURCES FOR PROGRAMMABLE LOGIC DEVICES

CROSS REFERENCE TO RELATED APPLICATION

This application claims the benefit of U.S. provisional patent application Ser. No. 60/038,288, filed Feb. 20, 1997.

BACKGROUND OF THE INVENTION

This invention relates to programmable logic devices, and more particularly to the organization of the basic logic modules of such devices and the sharing of certain control resources by groups of logic modules on such devices.

The basic logic module of a programmable logic device may include a small random-access memory and a register (flip-flop). The memory may be programmable to produce an output signal which is any logical combination of several inputs applied to the memory. For example, the memory may be a four-input look-up table which is programmable to produce an output signal which is any logical combination of the four inputs to the look-up table. The logic module may also include programmable logic connectors ("PLCs") for allowing the output of the memory to be applied to a register for storage and subsequent output as a registered output of the logic module. Alternatively or in addition, PLCs of the logic module may allow the output of the memory to be output by the logic module without registration by the register (i.e., as a so-called unregistered or combinatorial output of the logic module). If the output of the memory is not applied to the register, then PLCs of the logic module may allow the register to store and output one of the logic module inputs (so-called lonely register use of the register).

From the foregoing it will be seen that a logic module requires various control signals in addition to data signals. These control signals include a clock signal for clocking the register, and they may also include signals for controlling such functions as clearing the register and loading the register. In addition, it may be desirable to perform at least some of these functions synchronously or asynchronously.

If all possible control functions of all logic modules on a programmable logic device are individually controllable, excessive amounts of control circuitry may be required on the device. Moreover, much of that control circuitry will be unused and therefore wasted in the vast majority of uses of the device. It is therefore desirable to find configurations of logic module control circuitry that avoid such excess, but that still provide sufficient capability and flexibility of use that the device can meet the needs of a very wide range of users.

In view of the foregoing, it is an object of this invention to provide improved programmable logic devices.

It is a more particular object of this invention to provide improved control circuitry for logic modules and groups of logic modules on programmable logic devices.

SUMMARY OF THE INVENTION

These and other objects of the invention are accomplished in accordance with the principles of the invention by providing programmable logic devices in which logic modules (sometimes referred to as subregions of programmable logic) are clustered in groups (sometimes referred to as regions of programmable logic), and various control signals are provided on a region-wide basis. For example, two clock signals and two clear signals may be provided on a region-wide basis, and each register in the region may select either of these clock signals as its clock signal and either of these clear signals as its asynchronous clear signal. Each of these region-wide clock and clear signals may be selected from either a relatively global signal (e.g., a signal from a device-wide signal conductor which may be referred to as a fast conductor) or from a more local source such as the data inputs to a subregion in the region. Some of the region-wide control signals may also be used on a region-wide basis to control synchronous loading and/or synchronous clearing of the register.

Further features of the invention, its nature and various advantages will be more apparent from the accompanying drawings and the following detailed description of the preferred embodiments.

DETAILED DESCRIPTION OF THE PREFERRED EMBODIMENTS

Cliff et al. U.S. patent application Ser. No. 08/873,169, filed Jun. 11, 1997 (Docket No. 174/121), which is hereby incorporated by reference herein, shows representative portions of an illustrative programmable logic device with which the present invention can be used. Although it is assumed herein that the illustrative circuitry shown and described is being used in the context shown in the above-mentioned Cliff et al. reference, it will be understood that this is only one example of possible use of the invention and that the invention is equally usable in many other types and architectures of logic devices. To facilitate relating what is shown herein to the above-mentioned Cliff et al. reference, all of the reference numbers below 300 used herein are used for the same elements as the same reference numbers are applied to in the Cliff et al. reference.

Figure 1:
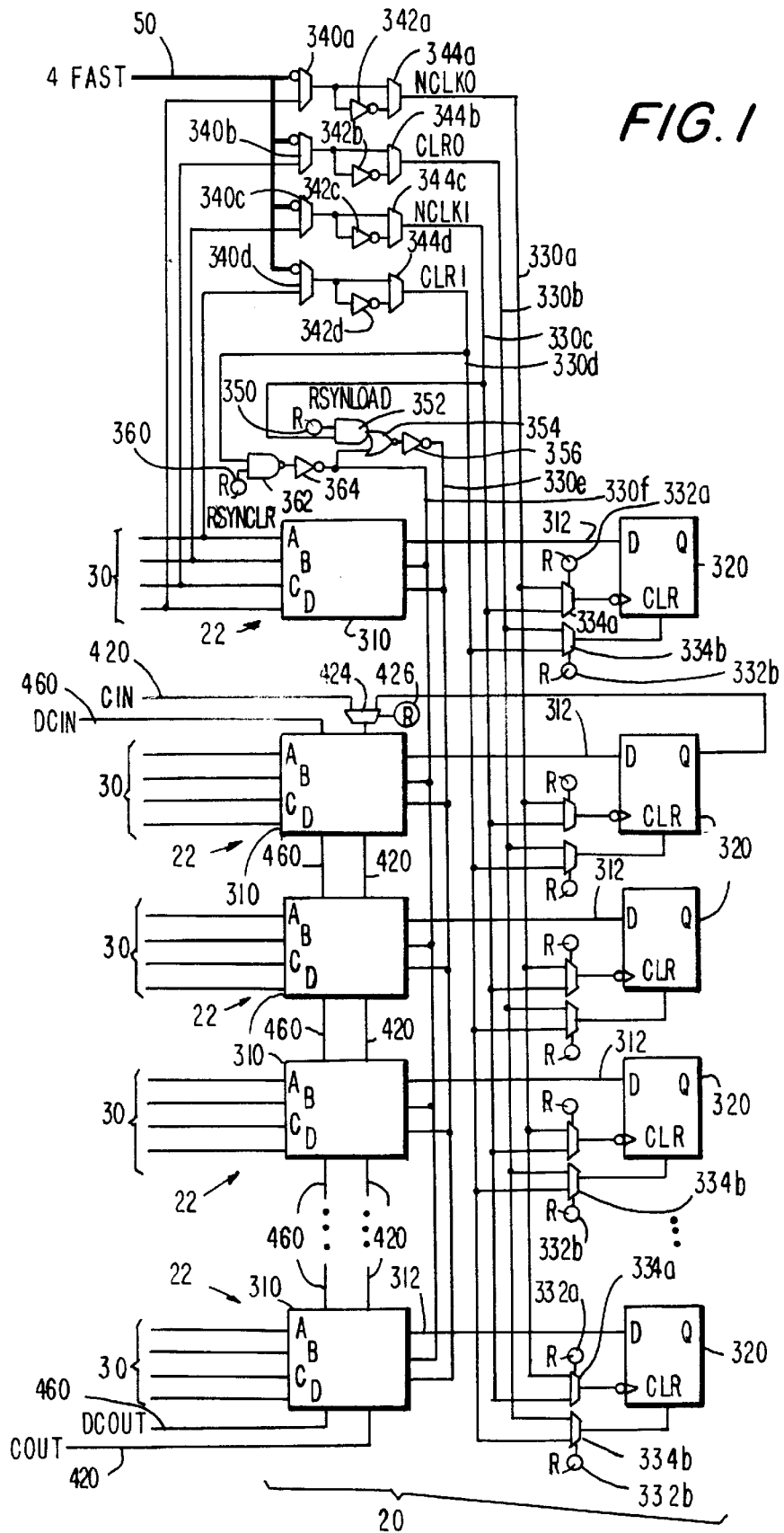
FIG. 1 is a simplified schematic block diagram of an illustrative embodiment of a representative portion of a programmable logic device constructed in accordance with the invention.

FIG. 1 shows a representative region 20 of programmable logic on a programmable logic device. Consistent with the preceding paragraph, region 20 may correspond to any of the regions 20 in the device 10 shown in the above-mentioned Cliff et al. reference. Region 20 includes several (e.g., ten) subregions 22 of programmable logic. Each subregion 22 includes a small random-access memory 310 and a register 320. For example, each memory 310 may be at least initially thought of as a four-input look-up table that is programmable to produce an output signal which is any logical combination of four input signals 30 applied to the look-up table. (Elements 310 may have some additional structure and capabilities that will be discussed later in connection with FIG. 2.) Each register 320 may be a flip-flop having a data input D, a data output Q, a clock input, and a clear input CLR.

All of the subregions 22 in region 20 are served by six control leads 330a–f. Control lead 330a carries a clock signal NCLK0. Control lead 330b carries a clear signal CLR0. Control lead 330c carries another clock signal NCLK1. Control lead 330d carries another clear signal CLR1. Control lead 330e carries a load or clear signal LDORCLR. And control lead 330f carries a synchronous clear signal SYNCLR.

Programmable logic connector ("PLC") 340a (e.g., a programmably controlled multiplexer) allows the inverse of the signal on any one of four fast conductors 50 on the programmable logic device, or the D input 30 of the first (top-most) subregion 22 in region 20 to be selected as the source of the NCLK0 signal on lead 330a. As described in more detail in the above-mentioned Cliff et al. reference, fast conductors 50 are global or relatively global signal propagation conductors on the programmable logic device. Thus fast conductors 50 typically extend to many regions 20, and they even extend to all of the regions 20 on the device. PLC 344a selects the true or complement of the output of PLC 340a as the actual NCLK0 signal. (The complement of the PLC 340a output is formed by inverter 342a.) Elements 340b, 342b, and 344b function similarly to allow the CLR0 signal on lead 330b to be selected from any of fast conductors 50 or the C input 30 to the first subregion 22. The same is true for elements 340c, 342c, and 344c, which allow selection of the NCLK1 signal on lead 330c from any of fast conductors 50 and the B input 30 to the first subregion 22. And elements 340d, 342d, and 344d allow selection of the CLR1 signal on lead 330d from any of fast conductors 50 and the A input 30 to the first subregion 22.

Each of flip-flops 320 has associated PLCs 334a and 334b for selecting either the NCLK0 signal on lead 330a or the NCLK1 signal on lead 330c as the clock signal for that flip-flop, and for selecting either the CLR0 signal on lead 330b or the CLR1 signal on lead 330d as the asynchronous clear signal for that flip-flop. The CLR input of a flip-flop 320 is used if and when it is desired to do an asynchronous clear of the flip-flop because the flip-flop resets as soon as the signal applied to its CLR input is asserted. The selection made by each of PLCs 334a and 334b is controlled by programming a function control element ("FCE") 332a or 332b that is associated with that PLC. For example, each FCE 332 may be a programmable memory cell on the programmable logic device. (Other PLCs on the device (e.g., PLCs 340 and 344) may be similarly controlled by similar FCEs, although FCEs are not separately shown for all of the depicted PLCs.)

The circuitry shown in FIG. 1 also includes elements for allowing the signals on leads 330c and 330d to be used to produce the LDORCLR signal on lead 330e and/or the SYNCLR signal on lead 330f as will now be described. The NCLK1 signal on lead 330c is applied to one input terminal of AND gate 352. The other input to AND gate 352 comes from RSYNLOAD FCE 350. The output signal of AND gate 352 is applied to one input of NOR gate 354. The other input to NOR gate 354 is the SYNCLR signal on lead 330f. The output of NOR gate 354 is inverted by inverter 356 to produce the LDORCLR signal on lead 330e.

The CLR1 signal on lead 330d is applied to one input of NAND gate 362. The other input to NAND gate 362 comes from RSYNCLR FCE 360. The output of NAND gate 362 is inverted by inverter 364 to produce the SYNCLR signal on lead 330f.

A truth table for the logic performed by elements 350–364 is as follows:

TABLE I

| RSYNCLR (FCE 360) | RSYNLOAD (FCE 350) | SYNCLR (Lead 330f) | LDORCLR (Lead 330e) |
|---|---|---|---|
| 0 | 0 | 0 | 0 |
| 0 | 1 | 0 | NCLK1 ("LOAD") |
| 1 | 0 | CLR1 | CLR1 |
| 1 | 1 | CLR1 | CLR1 OR NCLK1 ("LOAD") |

Figure 2:
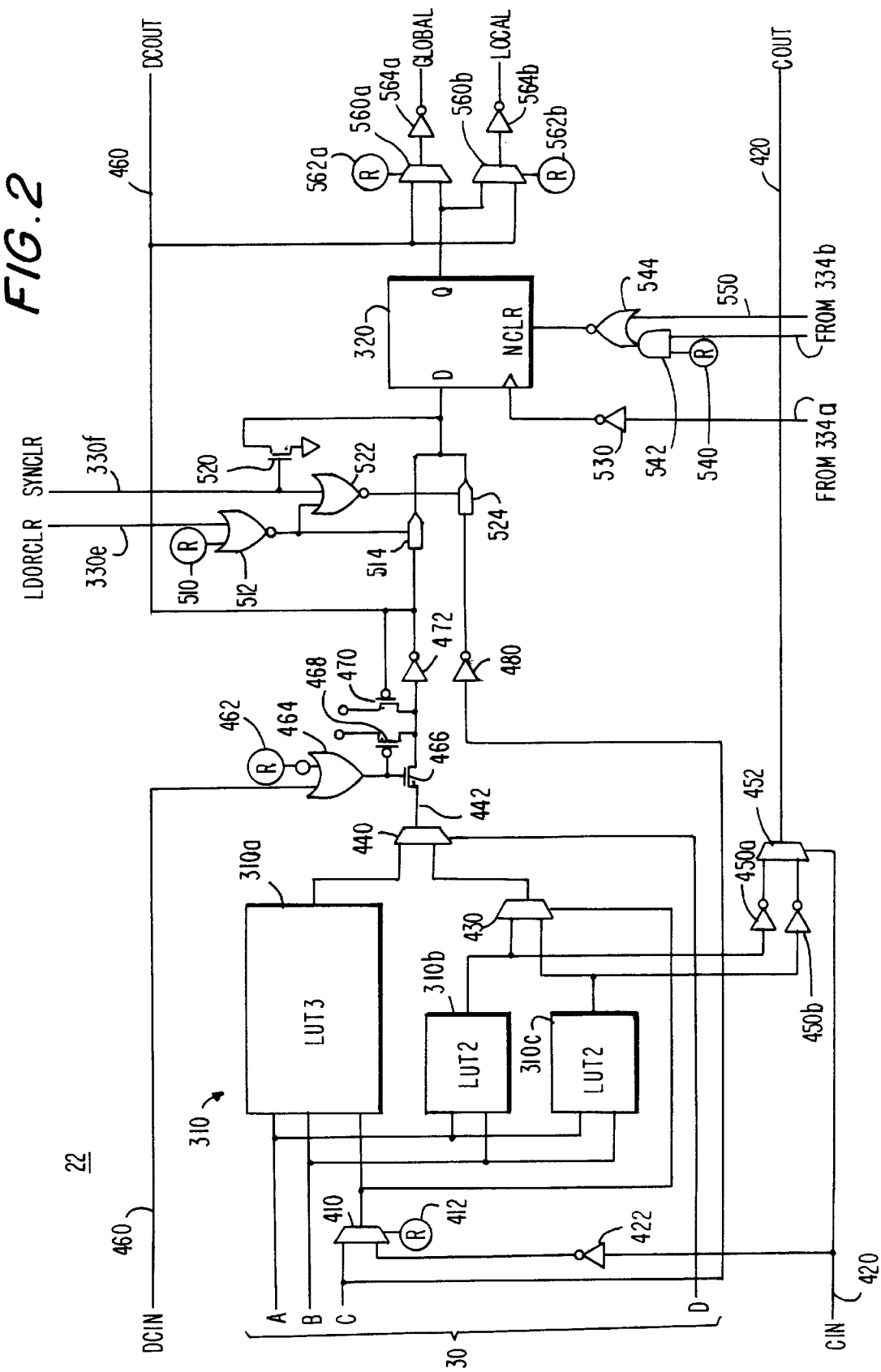
FIG. 2 is a schematic block diagram showing an illustrative embodiment of a representative portion of FIG. 1 in more detail.

The uses of the SYNCLR and LDORCLR signals will be more apparent from the following discussion of FIG. 2. In Table I NCLK1 is alternatively called LOAD, which may be better indicative of the function of this signal in this context.

FIG. 2 shows a representative subregion 22 in more detail. FIG. 2 is accurate for subregions other than the first (top-most) one in each region 20. The top-most subregion 22 in each region 20 does not participate in either the carry chain or the direct connect chain implemented in that region. Therefore the carry chain and direct connect chain logic shown in FIG. 2 can be omitted in order to produce the top-most subregion of a region.

In order to allow each subregion 22 to perform one place of binary arithmetic, the four-input look-up table 310 in the subregion is preferably implemented as a three-input look-up table 310a and two two-input look-up tables 310b and 310c. All three of look-up tables 310a–c receive the A and B inputs 30 of the subregion. PLC 410 (controlled by FCE 412) passes either the subregion's C input 30 or the subregion's inverted carry-in input CIN. (Inverter 422 inverts the carry-in signal for application to PLC 410.) FIG. 1 shows that each subregion 22 (other than the top-most one) has carry chain connections 420 from and to adjacent subregions 22. The ends of these carry chains in each region 20 continue with carry chain connections 420 to other adjacent regions 20. In order to facilitate starting a carry chain, the Q output of the next-to-top-most subregion 22 may be selected by PLC 424 (controlled by FCE 426) to be the carry-in signal to that subregion.

Returning to FIG. 2, the output signal of PLC 410 is applied to the third input to look-up table 310a and the control input terminal of PLC 430. The D input 30 of the subregion is applied to the control input terminal of PLC 440. The carry-in signal of the subregion is also applied to the control input terminal of PLC 452. The output signal of three-input look-up table 310a is applied to one of the data inputs of PLC 440. The outputs of two-input look-up tables 310b and 310c are respectively applied to the two data inputs of PLC 430. These two signals are also respectively inverted by inverters 450a and 450b and the results are applied to the two data inputs of PLC 452.

When subregion 22 is to perform one place of binary arithmetic, PLC 410 is programmed by FCE 412 to pass the carry-in signal, and three-input look-up table 310a is programmed to provide the sum-out bit from the arithmetic combination of A and B inputs 30 and carry-in input 420. D input 30 causes PLC 440 to pass this sum-out bit on to the further logic of the subregion. Two-input look-up tables 310b and 310c are programmed so that the carry-out signal COUT produced by PLC 452 is the carry-out bit that results from the arithmetic combination of A and B inputs 30 and carry-in input 420.

When subregion 22 is to perform logic other than one place of binary arithmetic, PLC 410 is programmed to pass C input 30, and carry logic elements 422, 450, and 452 are not used. Look-up tables 310a–c are programmed appropriately for the desired logic function, with C input 30 controlling PLC 430 to select the output of either table 310b or table 310c, and with D input 30 controlling PLC 440 to select the output of either table 310a or PLC 430 as the final output of look-up table circuitry 310.

In FIG. 2 the reference number 420 is used for both the CIN and COUT signals for consistency with FIG. 1.

Figure 3:
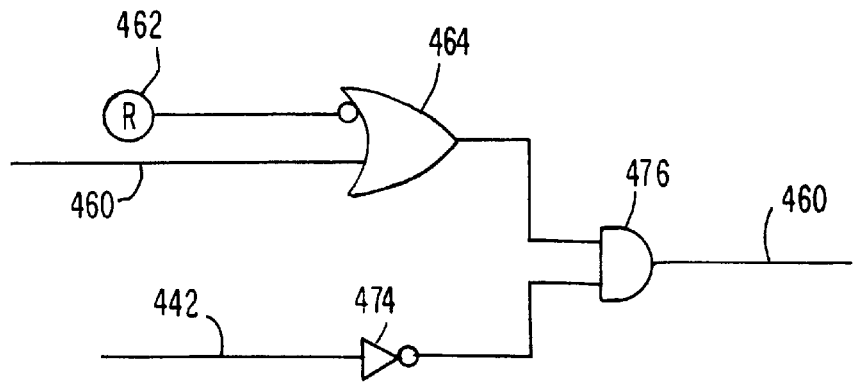
FIG. 3 shows an alternative representation of a portion of FIG. 2.

In addition to carry chain connections 420 between adjacent subregions 22, FIG. 1 shows that there are direct connect connections 460 between adjacent subregions (excluding the top-most subregion). Direct connect connections 460 allow the logic of two or more adjacent subregions to be cascaded without having to interconnect the subregions via the more general-purpose interconnection resources of the programmable logic device. Returning to FIG. 2, if it is desired to use the direct connect feature, FCE 462 is programmed logic 1. This signal is inverted for application to one input terminal of OR gate 464. With logic 0 thus applied to one of its input terminals, OR gate 464 is enabled to pass the direct connect input (DCIN) signal 460 that is applied to its other input terminal. Elements 466, 468, 470, and 472 then cooperate to effectively invert the output signal 442 of PLC 440 and produce the logical AND of that inverted signal and the DCIN signal passed by OR gate 464. (The logical equivalent of all of elements 462–472 is shown in FIG. 3, where inverter 474 represents the inversion of PLC 440 output signal 442, and AND gate 476 represents forming the logical AND of the inversion of signal 442 and the output signal of OR gate 464 to produce direct connect output signal (DCOUT) 460.) Again in FIG. 2 the reference number 460 is used for both the DCIN and DCOUT signals for consistency with FIG. 1.

If it is not desired to use the direct connect feature, FCE 462 is programmed logic 0. The inverted version of this signal applied to OR gate 464 prevents that gate from passing the direct connect input signal 460. Instead, the output signal of OR gate 464 is always high, and elements 466–472 merely invert PLC 440 output signal 442 (see again the equivalent logic shown in FIG. 3).

FIG. 2 also shows the logic which makes use of the LDORCLR and SYNCLR signals 330e and 330f in each subregion 22. This logic makes possible any of the following functions of the subregion: (1) synchronous clear of flip-flop 320, (2) synchronous load of flip-flop 320 from the output signal of inverter 472 (which can be either (a) from look-up table 310 alone, (b) the logical AND of DCIN and the output of look-up table 310, or (c) from DCIN alone (assuming that the output of look-up table 310 is programmed to be logic 1)), or (3) synchronous load of flip-flop 320 from the subregion's C input 30 (via inverter 480). Each of these functions is described in detail below.

Figure 4:
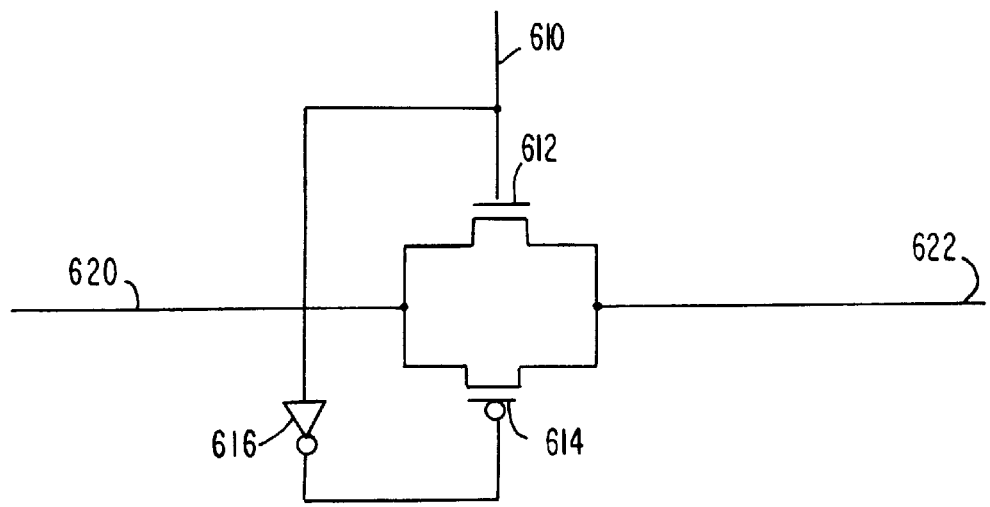
FIG. 4 is a simplified schematic block diagram of an illustrative embodiment of certain components shown in FIG. 2.

Synchronous clear of flip-flop 320 occurs on the next clock pulse after the SYNCLR signal on lead 330f has gone high (logic 1). (The LDORCLR signal on lead 330e must also be high for this to occur; but this will be true for the third and fourth lines in Table I above, and assuming that FCE 510 is programmed logic 0.) A logic 1 SYNCLR signal turns off switch circuit 524 via NOR gate 522 and turns on transistor 520, thereby connecting the D input of flip-flop 520 to ground. The concurrent logic 1 LDORCLR signal also turns off switch circuit 514 via NOR gate 512. The logic 0 (ground) D input to flip-flop 320 causes the flip-flop to reset when it receives the next clock pulse. (An illustrative embodiment of switch circuit 514 or 524 is shown in FIG. 4. When control input 610 is high, transistor 612 is turned on, and so is complementary transistor 614 with the aid of inverter 616. Data therefore passes through the switch from lead 620 to lead 622 with no VT drop. When control input 610 is low, both of transistors 612 and 614 are off.)

Synchronous load of flip-flop 320 from the combinatorial output signal of inverter 472 occurs when FCE 510 is programmed logic 0 and the LDORCLR signed on lead 330e has gone to logic 0. This causes the output signal of NOR gate 512 to become logic 1, thereby turning on switch circuit 514 so that the output signal of inverter 472 is applied to the D input of flip-flop 320. Then the next clock pulse applied to flip-flop 320 will cause the flip-flop to load its D input signal. Whenever the output signal of NOR gate 512 is logic 1, the output signal of NOR gate 522 is logic 0, which turns off switch circuit 524. SYNCLR must also be logic 0 during any non-zero synchronous load of flip-flop 320 (to prevent transistor 520 from turning on), but this is always true for the second line in Table I above, and it can also be true for the fourth line in Table I if CLR1 is logic 0 at the appropriate time. On the other hand, if the device is programmed in accordance with the fourth line in Table I and CLR1 is not logic 0 when it is attempted to load register 320 with non-zero data, that non-zero data will be over-ridden by synchronous load of logic 0 (from transistor 520).

Synchronous load of flip-flop 320 from C input 30 (via inverter 480) is provided when FCE 510 is programmed logic 1. This places subregion 22 in so-called lonely register mode (explained in more detail below). With FCE 510 programmed logic 1, the output of NOR gate 512 is always logic O and switch circuit 514 is always off. Then a low SYNCLR signal causes the output of NOR gate 522 to be logic 1. This turns on switch circuit 524, which applies the output signal of inverter 480 to the D input of flip-flop 320. The next clock pulse applied to flip-flop 320 causes the flip-flop to store its D input. Synchronous loading from C input 30 (like synchronous loading from the output of inverter 472) can be done when the device is programmed in accordance with either the second or fourth line of Table I. However, if programming is as in the fourth line of Table I, then CLR1 must be logic 0 when non-zero data is to be loaded from C input 30 into register 320. If that is not the case, then any non-zero data will be over-ridden by the loading of logic 0 in the register.

To briefly recapitulate, six operating conditions of flip-flop 320 have been described: (1) asynchronous clear (via the CLR input of the flip-flop), (2) synchronous clear (using high SYNCLR signal for grounding the D input of the flip-flop), (3) synchronous load from the look-up table output (produced by FCE 462=0, FCE 510=0, LDORCLR=0, and SYNCLR=0), (4) synchronous load from the logical AND of DCIN and the look-up table output (produced by FCE 462=1, FCE 510=0, LDORCLR=0, and SYNCLR=0), (5) synchronous load from DCIN (produced by FCE 462=1, look-up table programmed to output logic 1, FCE 510=0, LDORCLR=0, and SYNCLR=0), and (6) synchronous load from C input 30 (produced by FCE 510=1 and SYNCLR=0).

From the foregoing it will be seen that if a user of the device does not want either synchronous clear or synchronous load of the registers 320 in a region 20, then the user programs the RSYNCLR FCE 360 and the RSYNLOAD FCE 350 for that region logic 0 as in the first line of Table I above. If the user wants synchronous load but not synchronous clear of the registers 320 in a region 20, then the user programs the RSYNCLR FCE 360 for the region logic 0 and the RSYNLOAD FCE 350 for that region logic 1 as in the second line of Table I above. If the user wants synchronous clear but not synchronous load of the registers 320 in a region 20, then the user programs the RSYNCR FCE 360 for that region logic 1 and the RSYNLOAD FCE 350 for that region logic 0 as in the third line of Table I above. If the user wants both synchronous clear and synchronous load of the registers 320 in a region 20, then the user programs the RSYNCLR FCE 360 and the RSYNLOAD FCE 350 for that region logic 1 as in the fourth line of Table I above. In connection with the fourth line of Table I it is again noted that synchronous clear over-rides any simultaneously attempted synchronous load of non-zero data.

Considering now the clock and clear inputs to flip-flop 320, inverter 530 inverts the clock signal selected by the associated PLC 334a (FIG. 1). FCE 540 is programmable to enable AND gate 542 to pass the clear signal selected by associated PLC 334b if it is desired to allow asynchronous clear of flip-flop 320. Flip-flop 320 is then asynchronously reset whenever the clear signal from PLC 334b goes to logic 1, which causes the output signal of NOR gate 544 to become logic 0. (The clear input to flip-flop 320 in FIG. 2 is NCLR (inverted from CLR in FIG. 1).) An alternative system-wide clear is provided on lead 550, which also clears register 320 when it becomes logic 1.

The output stage of subregion 22 is shown to the right of flip-flop 320 in FIG. 2. As described in the above-mentioned Cliff et al. reference, each subregion 22 may have a so-called global output and a so-called local output. PLCs 560a and 560b (respectively controlled by FCEs 562a and 562b) allow either the unregistered combinatorial output signal from inverter 472 or the Q output signal of flip-flop 320 to be selected as either the global or local output (via inverters 564a and 564b, respectively). If lonely register mode operation of subregion 22 is selected (FCE 510 programmed logic 1), then the unregistered output of inverter 472 may be output as either the global or local output, while the registered C input 30 to the subregion is output as the other of the global and local outputs. Another possible lonely register use of the subregion is to output the signal from inverter 472 only via the DCOUT lead. Then the registered C input 30 to the subregion can be output as the global output, the local output, or both the global and local outputs.

Figure 5:
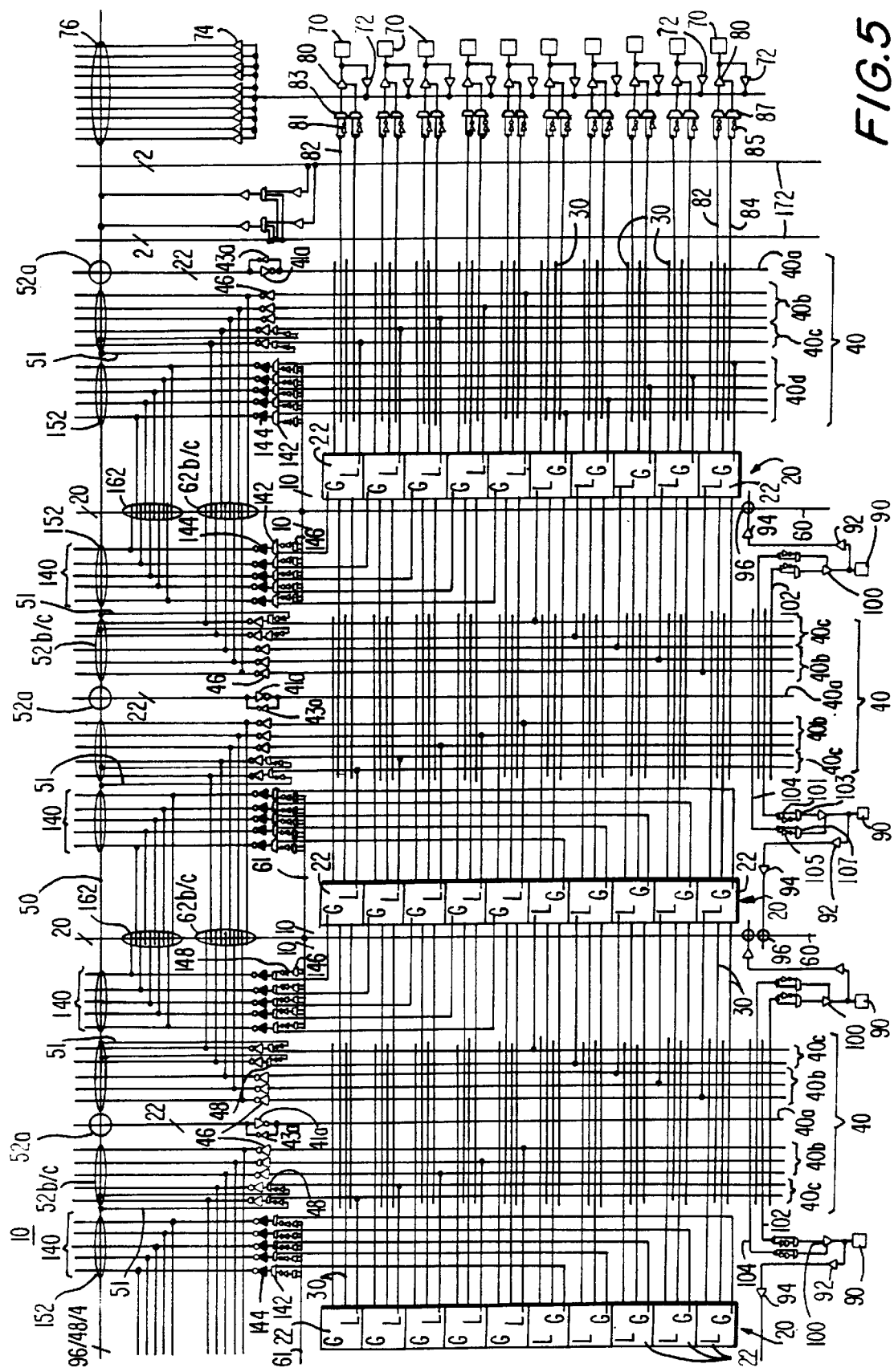
FIG. 5 is a simplified schematic block diagram of a larger representative portion of an illustrative embodiment of a programmable logic device constructed in accordance with the invention.

In order to more fully illustrate a context in which the circuitry of this invention may be used, FIG. 5 reproduces FIG. 1 from the above-mentioned Cliff et al. reference. Thus FIG. 5 shows the lower right-hand corner of an illustrative programmable logic device 10 which may be constructed in accordance with this invention. FIG. 5 shows three regions 20 of programmable logic from the lower-most of several rows of such regions on device 10. The three depicted regions 20 are also the lower-most regions in the three right-most of several columns of regions 20 on the device. The construction of each region 20 is as shown in more detail in FIGS. 1–4. "L" and "G" in FIG. 5 are respectively the local and global subregion outputs shown in FIG. 2.

Regions 20 are interspersed or interleaved with local interconnection conductors 40. In other words, a group of local conductors 40 is disposed between each horizontally adjacent pair of regions 20. In general, local conductors 40 are of three types, referenced 40a, 40b, and 40c. (A fourth type 40d is included in the right-hand-most group adjacent to input/output ("I/O") pins 70, as will be described in more detail below.) Conductors 40a may be referred to as region-feeding conductors, and 22 such conductors are shown in each group of local conductors 40. In general, conductors 40a are used for bringing signals into the adjacent regions (e.g., from the adjacent horizontal conductors 50 that are described below). A driver 41a and a level corrector 43a are included in each conductor 40a for ensuring adequate signal strength on that conductor.

Local conductors 40b and 40c may be referred to as output conductors. Each of conductors 40b and 40c receives the local output signal of an adjacent subregion 22 and can be used to convey that signal out to adjacent horizontal and/or vertical conductors 50 and 60 (described below). Each of conductors 40b and 40c includes a driver 46 for ensuring adequate signal strength on that conductor. The upper parts of conductors 40c can alternatively be used to provide connections from horizontal conductors 50 to other horizontal conductors 50 or to adjacent vertical conductors 60. This is done by programming the associated PLC 48 to disconnect the lower part of the conductor 40c from its upper part, and to instead connect a branch conductor 51 from one of conductors 50 to the upper part of that conductor 40c. If the upper part of a conductor 40c is used as has just been described, the lower part of that conductor can still be used independently for local transmission of a subregion output signal.

Of the four main inputs 30 to each subregion 22, two come from the left of that subregion, and two come from the right of the subregion. Each input conductor 30 is programmably connectable by PLCs to any of the local conductors 40 that it crosses. In this way signals on local conductors 40 can be brought into the adjacent subregions 22 via conductors 30. In particular, two inputs of a subregion can come from any local conductors 40 to the left of that subregion, and two inputs of a subregion can come from any local conductor to the right of that subregion.

Because the local output of each subregion 22 feeds an adjacent local conductor 40b and 40c, that local output can be fed back as an input to any of the subregions in the region that includes that subregion. That local output can also be supplied as an input signal to any of the subregions in the region to the side of the region from which the local output emerges without requiring use of any interconnection conductor resources other than a local conductor 40b or 40c. For example, the local output of the top-most subregion 22 in the center region 20 shown in FIG. 5 can be applied as an input to any subregion in that region or the region to the right. Similarly, the local output of the bottom-most subregion 22 in the center region 20 shown in FIG. 5 can be applied as an input to any subregion in that region or the region to the left.

In general, the global output signal of each subregion 22 is applied to the lower portion of a conductor 140. The lower portion of each such conductor 140 is connectable to the upper portion of that conductor via a PLC 142 and a driver 144 in order to drive the associated global subregion output signal out onto adjacent horizontal and/or vertical conductors 50 and 60. Alternatively, the upper portion of a conductor 140 may be used to connect an adjacent vertical conductor 60 to a horizontal conductor 50 or another vertical conductor 60. This is done using branch conductors 61 from conductors 60. A PLC 146 selects one of two associated branch conductors 61 and applies the selected signal to an associated driver 148. The associated one of above-mentioned PLCs 142 selects the output of driver 148 instead of the lower part of the associated conductor 140.

Each row of regions 20 has an associated group of horizontal conductors 50. For example, each group of conductors 50 may include 96 global horizontal conductors which extend all the way across the associated row, 48 half horizontal conductors adjacent to and extending along each left and right half of the associated row, and four so-called fast conductors also extending all the way across the associated row.

Each column of regions 20 has an associated group of vertical conductors 60. For example, each group of conductors 60 may include 20 global vertical conductors which extend all the way along the associated column.

Horizontal conductors 50 have PLCs 52a for selectively connecting selected conductors 50 to conductors 40a. For example, each conductor 40a may be connectable to any of approximately 13 conductors 50 via PLCs 52a. Each conductor 40b or 40c is selectively connectable to selected conductors 50 via PLCs 52b/c. For example, each conductor 40b or 40c may be connectable to any of four conductors 50 via PLCs 52b/c. Each conductor 40b or 40c is also selectively connectable to selected conductors 60 via PLCs 62b/c. For example, each conductor 40b or 40c may be connectable to either of two conductors 60 via PLCs 62b/c. Each of conductors 140 is selectively connectable to selected conductors 50 and 60 via PLCs 152 and 162, respectively. The same is true of somewhat analogous conductors 40d. For example, each conductor 140 or 40d may be connectable to any of six conductors 50 via PLCs 152 and to either of two conductors 60 via PLCs 162.

Adjacent each end of each row of regions 20 there are a plurality of horizontal I/O pins 70. For input purposes, the signal on each pin 70 can be applied to any one or more of several of the adjacent horizontal conductors 50 via drivers 72 and 74 and PLCs 76. For example, each pin 70 may drive any one or more of six global and half horizontal conductors 50 via PLCs 76. (The driving and use of the fast conductors in conductor group 50, as well as conductors 172 and associated elements, is explained later.) For output purposes, each pin 70 may be driven by a tri-state output driver 80. The data input to each driver 80 may be selected to be either the true or complement of the signal on an associated conductor 82. Inverter 81 forms the complement of the conductor 82 signal, and PLC 83 selects either the true or the complement signal for application to the data input terminal of driver 80. The output enable input to each driver 80 may be selected to be either the true or the complement of the signal on an associated conductor 84. Inverter 85 forms the complement of the conductor 84 signal, and PLC 87 selects either the true or the complement signal for application to the output enable input terminal of driver 80. Conductors 82 and 84 are somewhat like subregion input conductors 30 in that they are programmably connectable by PLCs to any of the local conductors 40 that they cross.

Adjacent each end of each column of regions 20 there are a plurality of vertical I/O pins 90. For input purposes, the signal on each pin 90 can be applied via drivers 92 and 94 and PLCs 96 to adjacent vertical conductors 60. For example, the signal from each pin 90 may be applied to either or both of two adjacent vertical conductors 60. For output purposes, each pin 90 may be driven by a tri-state output driver 100. The data input to each driver 100 may be either the true or complement of the signal on an associated conductor 102. An inverter 101 forms the complement of the conductor 102 signal, and PLC 103 selects either the true or complement for application to driver 100. Similarly, the output enable input to each driver 100 may be either the true or complement of the signal on an associated conductor 104. An inverter 105 forms the complement of the conductor 104 signal, and PLC 107 selects either the true or complement for application to driver 100. Conductors 102 and 104 are again like conductors 30 in that they can receive their signals via PLCs from any local conductors 40 that they cross.

The global outputs on the right-hand side of the subregions 22 in the right-most region 20 are routed somewhat differently than other global outputs. Each of these global outputs is connected to an additional local conductor 40d. Like other local conductors 40, conductors 40d are programmably connectable via PLCs to any conductor 30, 82, or 84 that they cross. This increases the number of signals available to drive and otherwise control I/O pins 70. In addition, conductors 40d are connectable to PLCs 144 like other subregion global outputs.

From the foregoing it will be seen that signals on horizontal conductors 50 can be applied to vertical conductors 60 via elements 51, 48, 46, and 62b/c. Signals on vertical conductors 60 can be applied to horizontal conductors 50 via elements 61, 146, 148, 142, 144, 140, and 152. Signals on horizontal conductors 50 can be brought into regions 20 via elements 52a and 40a, and applied as inputs to subregions 22 via elements 45 and 30. Local outputs of subregions 22 can be applied locally to nearby subregions via elements 40b/c, 45, and 30. Local outputs of subregions 22 can also be applied to horizontal and vertical conductors 50 and 60 via elements 40b/c, 48, 46, 52b/c, and 62b/c. Global outputs of subregions 22 can generally be applied to adjacent horizontal and vertical conductors 50 and 60 via components 140, 142, 144, 152, and 162. In the special case near the ends of the rows similar connections are made via elements 40d, 142, 144, 152, and 162. Outputs to pins 70 can come from anywhere on the device via horizontal conductors 50 and adjacent components 52a, 40a, 82, 81, 83, and 80. Alternatively, outputs to pins 70 can come from adjacent subregions 22 via adjacent elements 40b–d, 82, 81, 83, and 80. Output enables for pins 70 can come from sources similar to any that can provide output data, albeit via elements 84, 85, and 87. Outputs to pins 90 can come from horizontal conductors 50 via adjacent elements 52a, 40a, 102, 101, 103, and 100. Alternatively, outputs to pins 90 can come from adjacent subregions 22 via elements 40b or 40c, 102, 101, 103, and 100. Output enables for pins 90 can come from sources similar to any that can provide output data, albeit via elements 104, 105, and 107. Input routing from pins 70 and 90 has already been fully described.

Considering now the four fast conductors in each group of conductors 50, each of these conductors can be driven by fast input pins or by subregions 22 of the center two rows on device 10. Conductors 172 are used to distribute the various fast conductor source signals to the several rows of the device. More information regarding this aspect of the FIG. 5 structure is provided in the above-mentioned Cliff et al. reference.

Figure 6:
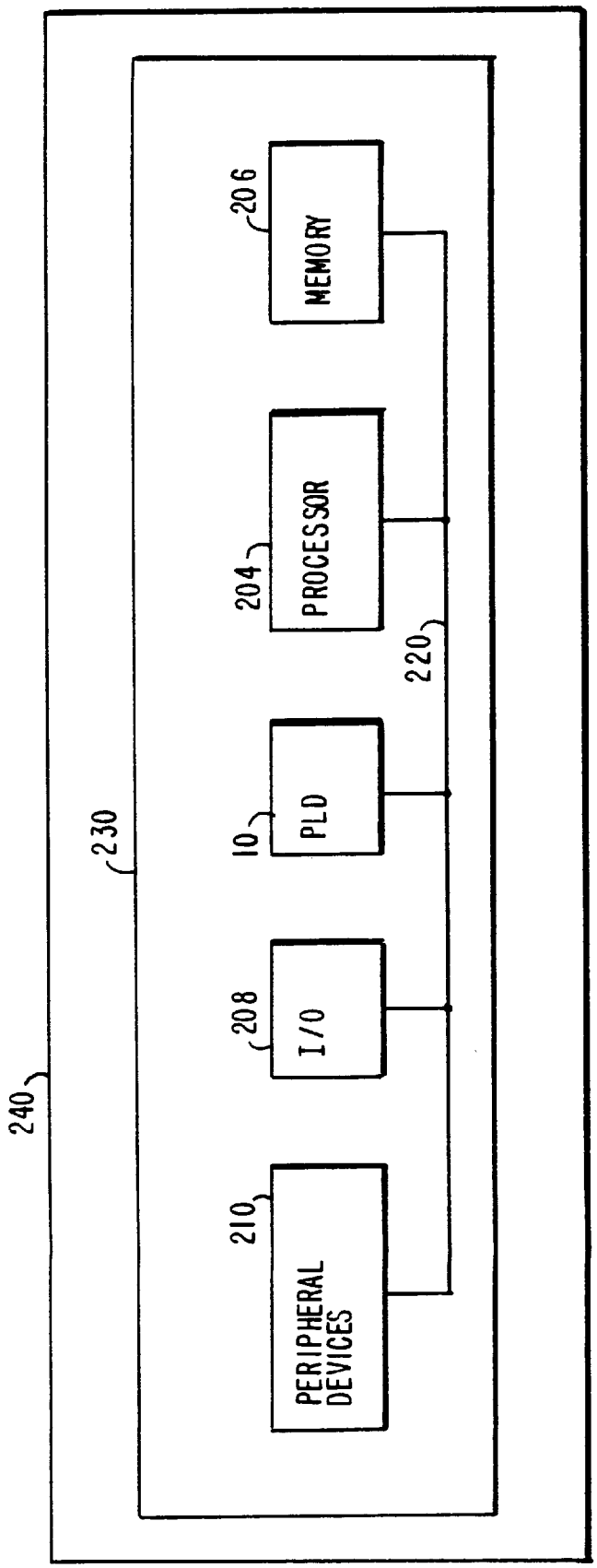
FIG. 6 is a simplified block diagram of an illustrative system employing a programmable logic device in accordance with the invention.

FIG. 6 illustrates a programmable logic device 10 of this invention in a data processing system 202. Data processing system 202 may include one or more of the following components: a processor 204; memory 206; I/O circuitry 208; and peripheral devices 210. These components are coupled together by a system bus 220 and are populated on a circuit board 230 which is contained in an end-user system 240.

System 202 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 204. Programmable logic device 10 may also be used as an arbiter for arbitrating access to a shared resource in system 202. In yet another example, programmable logic device 10 can be configured as an interface between processor 204 and one of the other components in system 202. It should be noted that system 202 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMS, EEPROMs, pass transistors, transmission gates, antifuses, laser fuses, metal optional links, etc. The components of PLCs can be controlled by various, programmable, function control elements ("FCEs"), which are-not always shown separately in the accompanying drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable both to one-time-only programmable and reprogrammable devices.

It will be understood that the foregoing is only illustrative of the principles of the invention and that various modifications can be made by those skilled in the art without departing from the scope and spirit of the invention. For example, the particular logic elements and groups of logic elements that have been shown for performing various functions are only illustrative, and other logically equivalent structures can be used instead if desired. The use of look-up tables for performing the basic logic of the subregions is also only illustrative, and the subregions can instead be implemented in other ways, in which other types of logic are performed. For example, the subregions could include sum-of-products logic implemented using EPROM devices. The inclusion of direct connect logic in the subregions is optional, and such logic can be omitted if desired. Similarly, the inclusion of arithmetic carry logic in the subregions is optional and can be omitted if desired.

The invention claimed is:

1. A region of programmable logic for inclusion in a programmable logic device comprising:
    a plurality of subregions of programmable logic, each subregion including a combinatorial logic portion configured to perform combinatorial logic on a plurality of data signals applied to the subregion to produce a combinatorial output signal and a register portion configured to register a signal applied to a data input terminal of the register portion;
    a plurality of control signal conductors extending adjacent to all of the subregions for applying signals on each of said control signal conductors to each of said subregions; and
    control circuitry in each of the subregions configured in response to signals on the control signal conductors to selectively apply the combinatorial output signal of the subregion to the data input terminal of the register portion of the subregion.

2. The apparatus defined in claim 1 further comprising:
    further control circuitry in each of the subregions configured in response to signals on the control signal conductors to selectively apply a register clearing signal to the data input terminal of the register portion of the subregion.

3. The apparatus defined in claim 1 further comprising:
    additional control circuitry in each of the subregions configured in response to signals on the control signal conductors to selectively apply a predetermined one of the data signals to the data input terminal of the register portion of the subregion.

4. The apparatus defined in claim 2 further comprising:
    additional control circuitry in each of the subregions configured in response to signals on the control signal conductors to selectively apply a predetermined one of the data signals to the data input terminal of the register portion of the subregion.

5. The apparatus defined in claim 1 wherein the register portion of each of the subregions is configured to respond to a clock signal applied to a clock input terminal of the register portion by registering the signal then applied to the data input terminal of the register portion.

6. The apparatus defined in claim 5 further comprising:
    a programmable logic connector associated with each of the subregions and configured to select the signal on one of plural ones of the control signal conductors as the clock signal of the register portion of that subregion.

7. The apparatus defined in claim 1 wherein the register portion of each of the subregions is configured to respond to a clear signal applied to a clear input terminal of the register portion by clearing any signal then registered by the register portion.

8. The apparatus defined in claim 7 further comprising:
    a programmable logic connector associated with each of the subregions and configured to select the signal on one of plural ones of the control signal conductors as the clear signal of the register portion of that subregion.

9. The apparatus defined in claim 1 wherein the programmable logic device includes a plurality of signal distribution conductors configured to distribute signals to plural regions of programmable logic on the device, and wherein the region further comprises:
    a programmable logic connector associated with each of the control signal conductors and configured to select the signal on one of plural ones of the signal distribution conductors as the signal on that control signal conductor.

10. A digital processing system comprising:
    processing circuitry;
    memory circuitry coupled to the processing circuitry; and
    apparatus as defined in claim 1 coupled to the processing circuitry and the memory circuitry.

11. A printed circuit board on which is mounted apparatus as defined in claim 1.

12. The printed circuit board defined in claim 11 further comprising:
    memory circuitry mounted on the printed circuit board and coupled to said apparatus.

13. The printed circuit board defined in claim 12 further comprising:
    processing circuitry mounted on the printed circuit board and coupled to said apparatus.

14. A region of programmable logic for inclusion in a programmable logic device comprising:

a plurality of subregions of programmable logic, each subregion including a combinatorial logic portion configured to perform combinatorial logic on a plurality of data signals applied to the subregion to produce a combinatorial output signal and a register portion configured to register a signal applied to a data input terminal of the register portion;

a plurality of control signal conductors extending adjacent to all of the subregions for applying signals on each of said control signal conductors to each of said subregions; and control circuitry in each of the subregions configured in response to signals on the control signal conductors to selectively apply a predetermined one of the data signals to the data input terminal of the register portion of the subregion.

15. The apparatus defined in claim 14 further comprising:

further control circuitry in each of the subregions configured in response to signals on the control signal conductors to selectively apply a register clearing signal to the data input terminal of the register portion of the subregion.

16. The apparatus defined in claim 14 wherein the register portion of each of the subregions is configured to respond to a clock signal applied to a clock input terminal of the register portion by registering the signal then applied to the data input terminal of the register portion.

17. The apparatus defined in claim 16 further comprising:

a programmable logic connector associated with each of the subregions and configured to select the signal on one of plural ones of the control signal conductors as the clock signal of the register portion of that subregion.

18. The apparatus defined in claim 14 wherein the register portion of each of the subregions is configured to respond to a clear signal applied to a clear input terminal of the register portion by clearing any signal then registered by the register portion.

19. The apparatus defined in claim 18 further comprising:

a programmable logic connector associated with each of the subregions and configured to select the signal on one of plural ones of the control signal conductors as the clear signal of the register portion of that subregion.

20. The apparatus defined in claim 14 wherein the programmable logic device includes a plurality of signal distribution conductors configured to distribute signals to plural regions of programmable logic on the device, and wherein the region further comprises:

a programmable logic connector associated with each of the control signal conductors and configured to select the signal on one of plural ones of the signal distribution conductors as the signal on that control signal conductor.

21. A digital processing system comprising:

processing circuitry;

memory circuitry coupled to the processing circuitry; and apparatus as defined in claim 14 coupled to the processing circuitry and the memory circuitry.

22. A printed circuit board on which is mounted apparatus as defined in claim 14.

23. The printed circuit board defined in claim 22 further comprising:

memory circuitry mounted on the printed circuit board and coupled to said apparatus.

24. The printed circuit board defined in claim 22 further comprising:

processing circuitry mounted on the printed circuit board and coupled to said apparatus.

25. A region of programmable logic for inclusion in a programmable logic device comprising:

a plurality of subregions of programmable logic, each subregion including a combinatorial logic portion configured to perform combinatorial logic on a plurality of data signals applied to the subregion to produce a combinatorial output signal and a register portion configured to register a signal applied to a data input terminal of the register portion;

a plurality of control signal conductors extending adjacent to all of the subregions for applying signals on each of said control signal conductors to each of said subregions;

a programmable logic connector associated with each of the control signal conductors and configured to select a data signal applied to one of the subregions as the signal on the control signal conductor associated with that programmable logic connector; and control circuitry in each of the subregions configured in response to signals on the control signal conductors to selectively apply the combinatorial output signal of the subregion to the data input terminal of the register portion of the subregion.

26. The apparatus defined in claim 25 further comprising:

further control circuitry in each of the subregions configured in response to signals on the control signal conductors to selectively apply a register clearing signal to the data input terminal of the register portion of the subregion.

27. The apparatus defined in claim 25 further comprising:

additional control circuitry in each of the subregions configured in response to signals on the control signal conductors to selectively apply a predetermined one of the data signals to the data input terminal of the register portion of the subregion.

28. The apparatus defined in claim 26 further comprising:

additional control circuitry in each of the subregions configured in response to signals on the control signal conductors to selectively apply a predetermined one of the data signals to the data input terminal of the register portion of the subregion.

29. The apparatus defined in claim 25 wherein the register portion of each of the subregions is configured to respond to a clock signal applied to a clock input terminal of the register portion by registering the signal then applied to the data input terminal of the register portion.

30. The apparatus defined in claim 29 further comprising:

a programmable logic connector associated with each of the subregions and configured to select the signal on one of plural ones of the control signal conductors as the clock signal of the register portion of that subregion.

31. The apparatus defined in claim 25 wherein the register portion of each of the subregions is configured to respond to a clear signal applied to a clear input terminal of the register portion by clearing any signal then registered by the register portion.

32. The apparatus defined in claim 31 further comprising:

a programmable logic connector associated with each of the subregions and configured to select the signal on one of plural ones of the control signal conductors as the clear signal of the register portion of that subregion.

33. The apparatus defined in claim 25 wherein the programmable logic device includes a plurality of signal distribution conductors configured to distribute signals to plural regions of programmable logic on the device wherein the programmable logic connector associated with each of the control signal conductors is additionally configured to select the signal on one of plural ones of the signal distribution conductors as the signal on that control signal conductor.

34. A digital processing system comprising:
processing circuitry;
memory circuitry coupled to the processing circuitry; and
apparatus as defined in claim 25 coupled to the processing circuitry and the memory circuitry.

35. A printed circuit board on which is mounted apparatus as defined in claim 25.

36. The printed circuit board defined in claim 35 further comprising:
memory circuitry mounted on the printed circuit board and coupled to said apparatus.

37. The printed circuit board defined in claim 35 further comprising:
processing circuitry mounted on the printed circuit board and coupled to said apparatus.

38. A region of programmable logic for inclusion in a programmable logic device comprising:
a plurality of subregions of programmable logic, each subregion including a combinatorial logic portion configured to perform combinatorial logic on a plurality of data signals applied to the subregion to produce a combinatorial output signal and a register portion configured to register a signal applied to a data input terminal of the register portion;
a plurality of control signal conductors extending adjacent to all of the subregions for applying signals on each of said control signal conductors to each of said subregions;
a programmable logic connector associated with each of the control signal conductors and configured to select a data signal applied to one of the subregions as the signal on the control signal conductor associated with that programmable logic connector; and
control circuitry in each of the subregions configured in response to signals on the control signal conductors to selectively apply a predetermined one of the data signals to the data input terminal of the register portion of the subregion.

39. The apparatus defined in claim 38 further comprising:
further control circuitry in each of the subregions configured in response to signals on the control signal conductors to selectively apply a register clearing signal to the data input terminal of the register portion of the subregion.

40. The apparatus defined in claim 38 wherein the register portion of each of the subregions is configured to respond to a clock signal applied to a clock input terminal of the register portion by registering the signal then applied to the data input terminal of the register portion.

41. The apparatus defined in claim 40 further comprising:
a programmable logic connector associated with each of the subregions and configured to select the signal on one of plural ones of the control signal conductors as the clock signal of the register portion of that subregion.

42. The apparatus defined in claim 38 wherein the register portion of each of the subregions is configured to respond to a clear signal applied to a clear input terminal of the register portion by clearing any signal then registered by the register portion.

43. The apparatus defined in claim 42 further comprising:
a programmable logic connector associated with each of the subregions and configured to select the signal on one of plural ones of the control signal conductors as the clear signal of the register portion of that subregion.

44. The apparatus defined in claim 38 wherein the programmable logic device includes a plurality of signal distribution conductors configured to distribute signals to plural regions of programmable logic on the device wherein the programmable logic connector associated with each of the control signal conductors is additionally configured to select the signal on one of plural ones of the signal distribution conductors as the signal on that control signal conductor.

45. A digital processing system comprising:
processing circuitry;
memory circuitry coupled to the processing circuitry; and
apparatus as defined in claim 38 coupled to the processing circuitry and the memory circuitry.

46. A printed circuit board on which is mounted apparatus as defined in claim 38.

47. The printed circuit board defined in claim 46 further comprising:
memory circuitry mounted on the printed circuit board and coupled to said apparatus.

48. The printed circuit board defined in claim 46 further comprising:
processing circuitry mounted on the printed circuit board and coupled to said apparatus.

* * * * *